United States Patent
Hilmoe

(12) 
(10) Patent No.: US 6,468,023 B1
(45) Date of Patent: Oct. 22, 2002

(54) APPARATUS AND METHOD FOR INVERTING AN IC DEVICE

(75) Inventor: Mark K. Hilmoe, Powell, OH (US)

(73) Assignee: Delta Design, Inc., Poway, CA (US)

( * ) Notice: Subject to any disclaimer, the term of this patent is extended or adjusted under 35 U.S.C. 154(b) by 0 days.

(21) Appl. No.: 09/453,463

(22) Filed: Dec. 2, 1999

Related U.S. Application Data

(60) Provisional application No. 60/110,827, filed on Dec. 2, 1998.

(51) Int. Cl.$^7$ ................................................. B25J 7/28
(52) U.S. Cl. ........................ 414/763; 414/773; 414/783
(58) Field of Search ................................ 414/741, 758, 414/761, 763, 773, 783

(56) References Cited

U.S. PATENT DOCUMENTS

| | | | | |
|---|---|---|---|---|
| 4,160,507 A | * | 7/1979 | Mullins | 414/783 X |
| 4,255,075 A | * | 3/1981 | Babbitt | 414/773 X |
| 4,506,213 A | | 3/1985 | O'Connor | 324/73 AT |
| 4,604,572 A | | 8/1986 | Horiuchi et al. | 324/158 F |
| 4,777,434 A | | 10/1988 | Miller et al. | 324/158 F |
| 4,926,118 A | | 5/1990 | O'Connor et al. | 324/158 F |
| 5,006,796 A | | 4/1991 | Burton et al. | 324/158 F |
| 5,093,984 A | | 3/1992 | Lape | 29/741 |
| 5,126,656 A | | 6/1992 | Jones | 324/158 F |
| 5,143,450 A | | 9/1992 | Smith et al. | 374/12 |
| 5,164,661 A | | 11/1992 | Jones | 324/158 F |
| 5,172,049 A | | 12/1992 | Kiyokawa et al. | 324/158 F |
| 5,177,435 A | | 1/1993 | Kiyokawa et al. | 324/158 F |
| 5,180,975 A | | 1/1993 | Andoh et al. | 324/158 F |
| 5,201,875 A | | 4/1993 | Tessier et al. | 294/64.1 |
| 5,208,529 A | | 5/1993 | Tsurishima et al. | 324/158 F |
| 5,227,717 A | | 7/1993 | Tsurishima et al. | 324/158 F |
| 5,261,775 A | | 11/1993 | Kobayashi | 414/403 |
| 5,263,775 A | | 11/1993 | Smith et al. | 374/134 |
| 5,290,134 A | | 3/1994 | Baba | 414/404 |
| 5,307,011 A | | 4/1994 | Tani | 324/158 F |
| 5,310,039 A | | 5/1994 | Butera et al. | 198/346.2 |
| 5,313,156 A | | 5/1994 | Klug et al. | 324/158 F |
| 5,315,240 A | | 5/1994 | Jones | 324/158 F |
| 5,330,043 A | | 7/1994 | Stuckey | 198/346.2 |
| 5,374,158 A | | 12/1994 | Tessier et al. | 414/759 |
| 5,374,888 A | * | 12/1994 | Karasawa | 324/765 |
| 5,420,521 A | | 5/1995 | Jones | 324/760 |
| 5,469,953 A | | 11/1995 | Igarashi et al. | 198/345.2 |
| 5,563,521 A | | 10/1996 | Crumly | 324/757 |
| 5,574,383 A | | 11/1996 | Saito et al. | 324/755 |
| 5,588,797 A | | 12/1996 | Smith | 414/797.5 |
| 5,614,837 A | | 3/1997 | Itoyama et al. | 324/760 |
| 5,648,728 A | | 7/1997 | Canella | 324/755 |
| 5,690,467 A | | 11/1997 | Smith | 414/795.2 |
| 5,807,066 A | | 9/1998 | Smith | 414/802 |
| 5,847,293 A | | 12/1998 | Jones | 73/865.8 |
| 5,894,217 A | | 4/1999 | Igarashi et al. | 324/158.1 |
| 6,184,697 B1 | * | 2/2001 | Suga | 324/754 |

FOREIGN PATENT DOCUMENTS

JP 3-272918 * 12/1991 .................. 414/773

* cited by examiner

*Primary Examiner*—Janice L. Krizek
(74) *Attorney, Agent, or Firm*—Foley & Lardner

(57) ABSTRACT

An IC handler inverts an IC in a single motion by first gripping the IC with two fingers attached to an arm and then flipping the IC over by rotating the arm in a one-hundred eighty degree arc. The fingers maintain contact with the IC during the entire one-hundred eighty degree motion. The fingers grip the IC from the sides so that they can drop the IC onto a carrier after flipping the IC. After flipping, the IC is lowered onto the carrier by an air cylinder until two precising pins engage the carrier. The IC can thus be delivered to a testing device with its electrical contacts facing up.

16 Claims, 8 Drawing Sheets

APPARATUS AND METHOD FOR INVERTING AN IC DEVICE

CROSS-REFERENCE TO RELATED APPLICATION

This application claims the priority of previously filed provisional application number 60/110,827, filed on Dec. 2, 1998, which is hereby fully incorporated by reference.

BACKGROUND OF THE INVENTION

1. Field of the Invention

This invention relates in general to the field of handling an integrated circuit ("IC") device, and more particularly to an improved apparatus and method of inverting an IC device.

2. Description of the Related Art

Various schemes have been proposed for moving IC devices between carriers or trays and the test head of a test system. A common approach is to use a vacuum chuck to pick up a device from a tray and to place it in a contactor on a load board which provides the interface to the test head of the test system. This is known as "pick and place" and examples of this are found in U.S. Pat. No. 5,469,953 and U.S. Pat. No. 5,290,134 which describe the use of a suction chuck to lift an IC device from a tray and lower it into a tester or into another tray. U.S. Pat. No. 5,330,043 describes a pair of transfer heads mounted at forty-five degrees to a rotatable drive shaft and ninety degrees to each other. Each transfer head has a vacuum chuck for picking devices from a horizontal tray and a drive arm for lifting the head and advancing it to a vertical test head after rotation of the shaft. Devices are returned to the tray by reverse rotation and lowering of the transfer head. One head is over the tray when the other is against the test head. Other pick and place systems have one or more vacuum chucks on a mechanism for X, Y, and Z motion to allow devices to be placed in testers.

All of these pick and place methods place the IC device in the same orientation in which they pick it up. The IC device is typically taken from a tray, on which the IC device is resting in a "live bug" position (connections down), by the pick and place handling system. The vacuum handling device of the pick and place system picks up the IC device from its tray and places the IC device on a carrier, still in a live bug position. The carrier slides or moves through the conveyor towards the test site. At times, however, it is useful to transpose the IC device from its "live bug" position to a "dead bug" position, that is, a position where the connectors of the IC device are pointing up instead of down.

Therefore, a need has arisen for an improved apparatus and method of inverting an IC device.

SUMMARY OF THE INVENTION

A device and method are described for gripping a semiconductor device, rotating the device through an arc of approximately one-hundred eighty degrees, and releasing the semiconductor device. The semiconductor device is rotated in a vertical plane, thereby inverting it.

Briefly, in accordance with one aspect of the present invention, there is provided an inversion handler for inverting a device under test ("DUT"). The inversion handler includes a holding assembly and a shaft. The holding assembly is for releasably securing the DUT. The shaft is coupled to the holding assembly and is adapted to be rotated, thereby rotating and eventually inverting the holding assembly.

Briefly, in accordance with another aspect of the present invention, there is provided a method of inverting a device under test ("DUT"). The method includes releasably securing the DUT with a holding assembly such that a point of contact is made between the DUT and the holding assembly. The holding assembly is coupled to a shaft. The method further includes rotating, and eventually inverting, the releasably secured DUT by rotating the holding assembly while maintaining the point of contact between the DUT and the holding assembly. The method further includes releasing the releasably secured DUT.

Briefly, in accordance with another aspect of the present invention, there is provided an inversion handler for inverting an integrated circuit ("IC") device under test ("DUT"). The inversion handler includes a stationary finger, a movable finger, a shaft, and a driving device. The movable finger is adapted to be moved to releasably secure the IC DUT between the stationary finger and the movable finger. The driving device is coupled to the shaft and is for rotating the shaft approximately one-hundred eighty degrees. Such rotation will rotate the stationary finger and the movable finger in a vertical plane, such that the stationary finger and the movable finger are inverted.

DESCRIPTION OF SPECIFIC EMBODIMENTS

Figure 1:
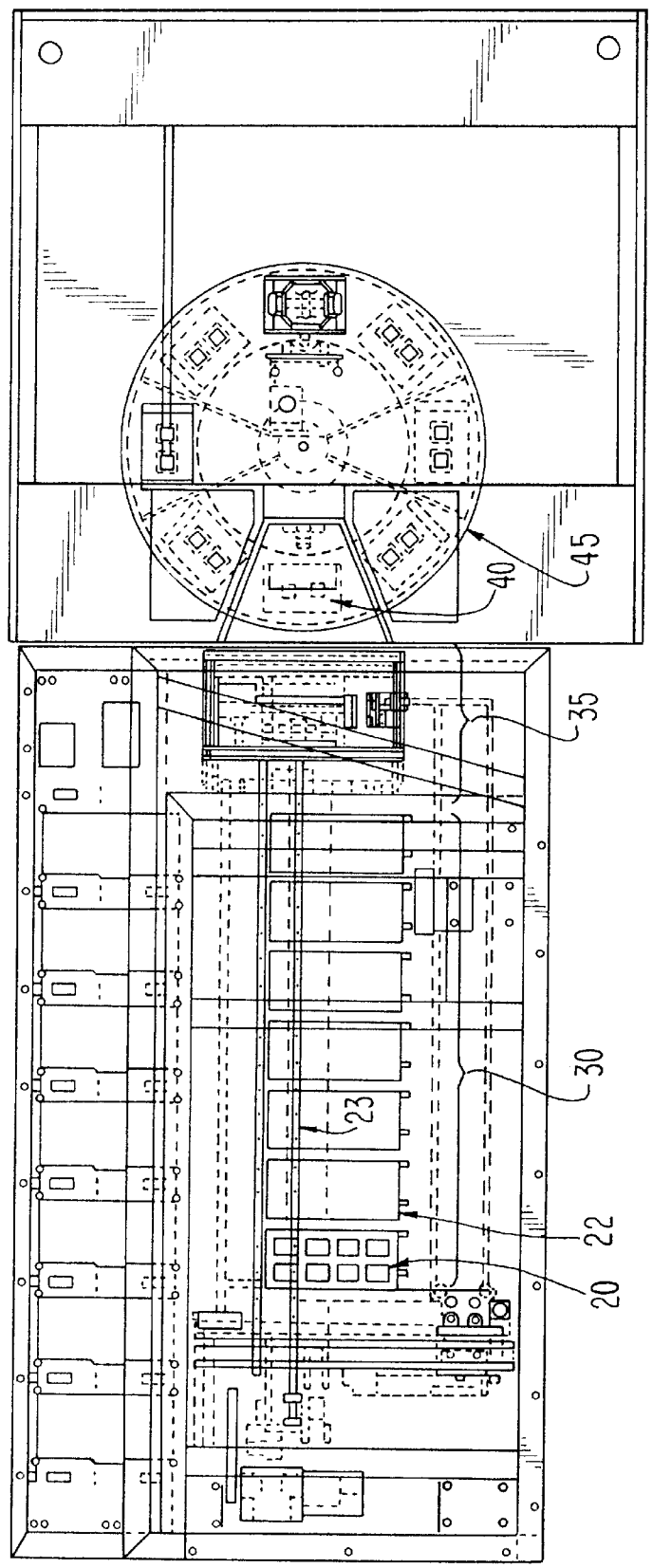
FIG. 1 is a top plan view of a transportation and temperature control system in accordance with an embodiment of the present invention.

The above-noted and other aspects of the present invention will become more apparent from a description of the preferred embodiment, when read in conjunction with the accompanying drawings. The drawings illustrate an embodiment of the invention. In the drawings, the same members have the same reference numerals.

1. Structure

Referring to FIG. 1, as disclosed in co-pending provisional application U.S. Ser. No. 60/110,829, filed on Dec. 2, 1998, and hereby fully incorporated by reference, an IC device 20 in a JEDEC tray 22 travels along an axis 23 to a staging area 30. An inversion handler 35 is able to transfer the IC device 20 between the staging area 30 and a carrier 40, the carrier 40 being in a rotary transport device 45.

Figure 3:
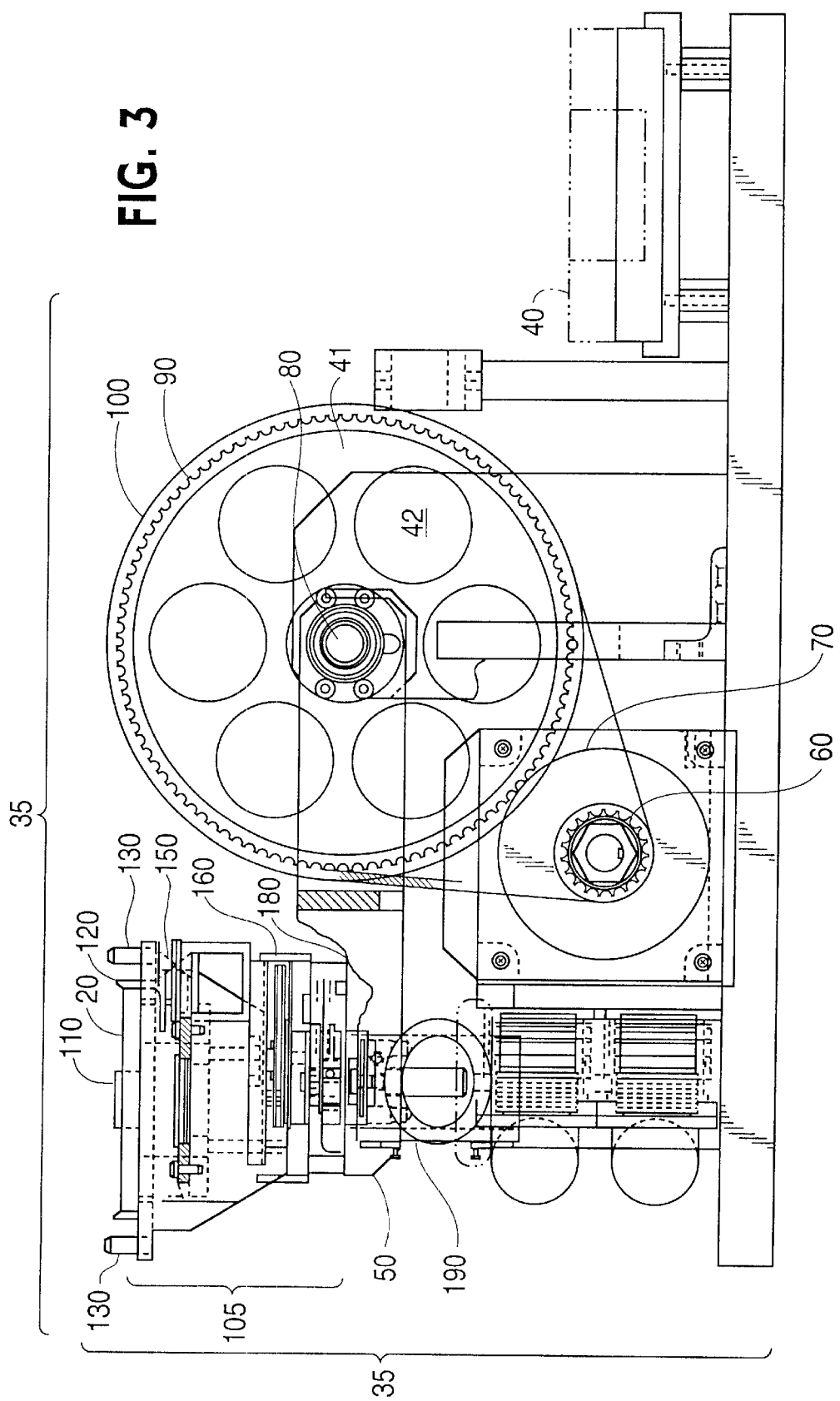
FIG. 3 is a cross-sectional side view showing an inversion handler in accordance with an embodiment of the present invention.
Figure 4:
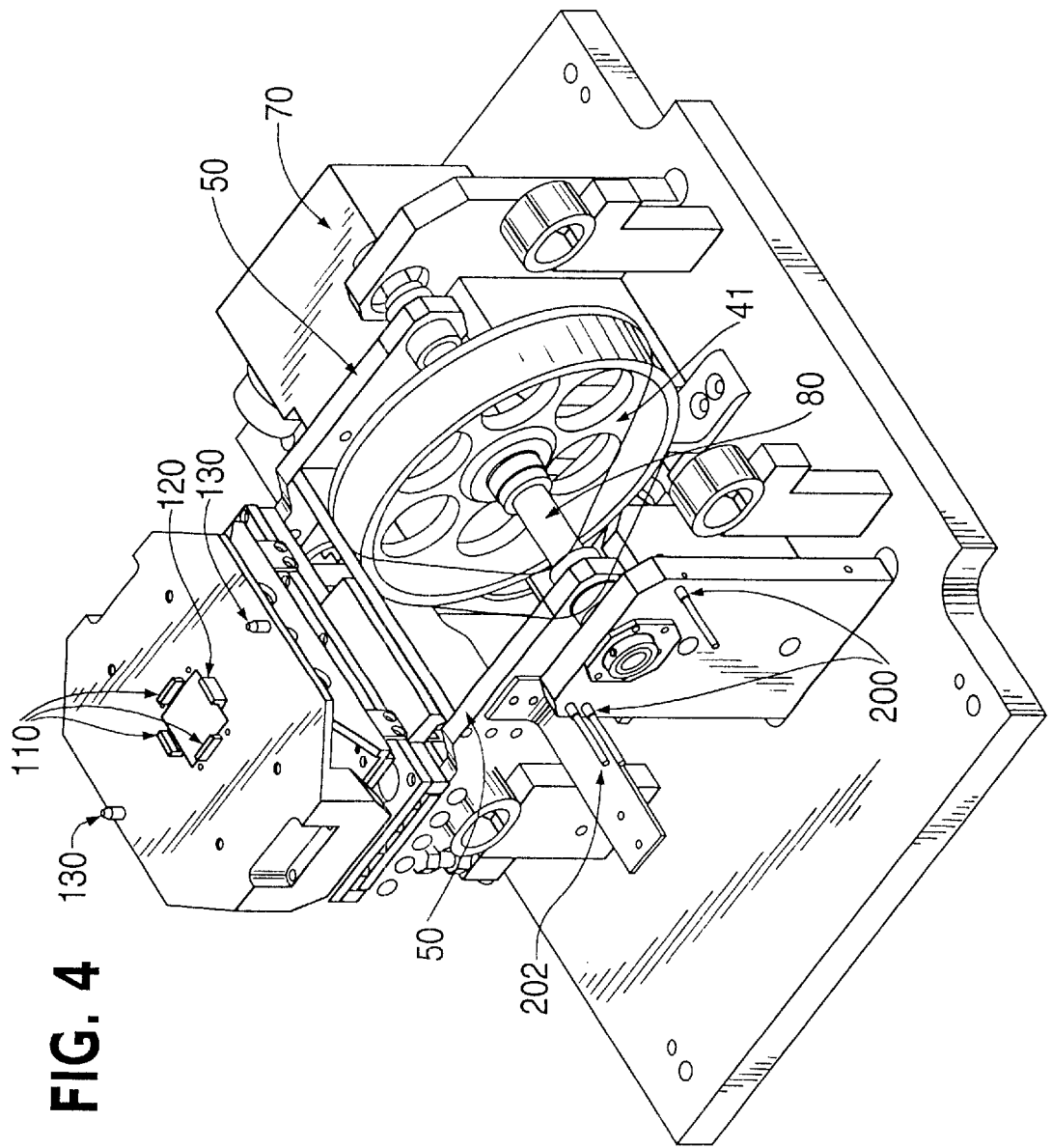
FIG. 4 is a perspective view of the inversion handler of FIG. 3.
Figure 5:
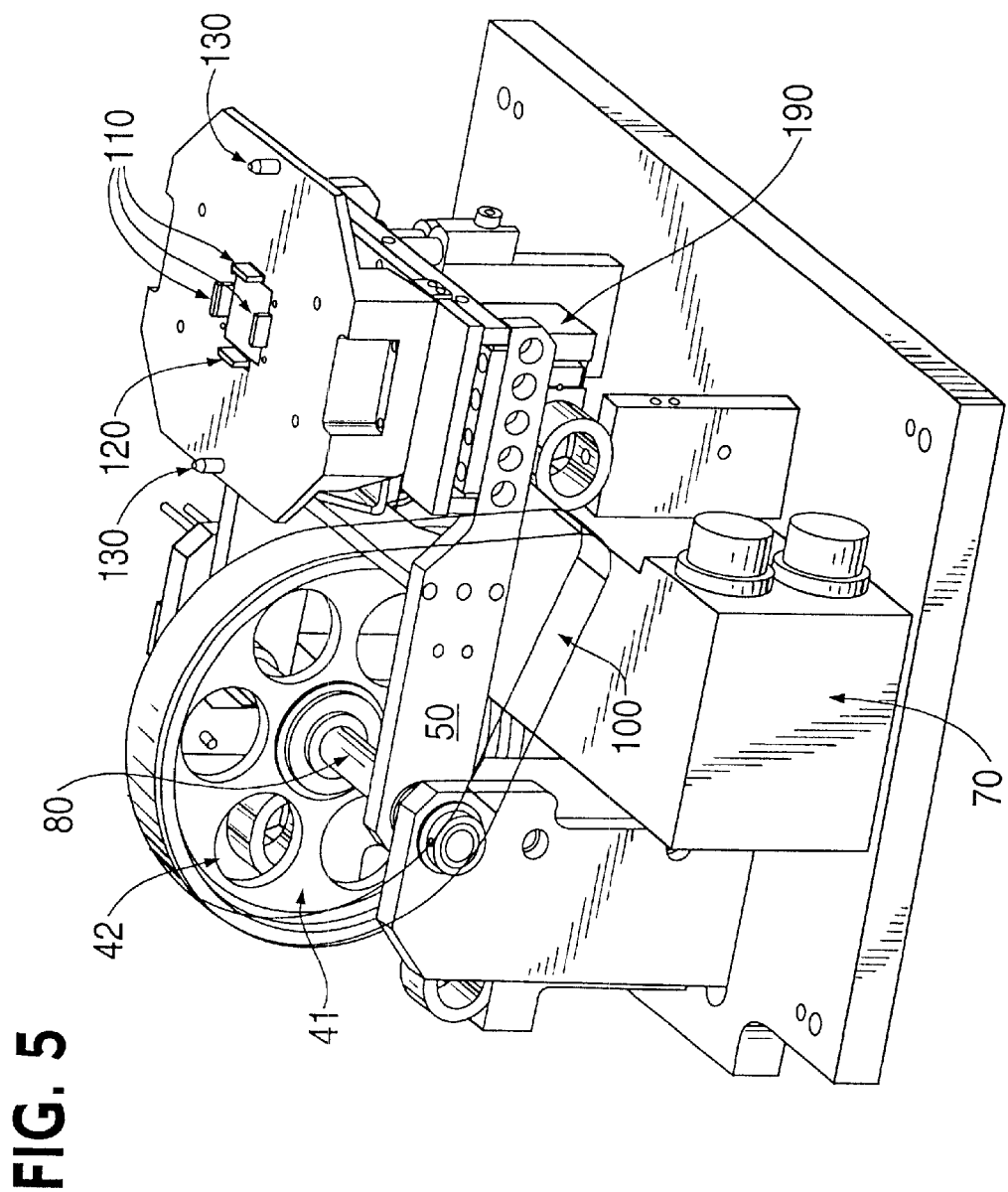
FIG. 5 is another perspective view of the inversion handler of FIG. 3.

The following discussion refers to FIGS. 3–5. Unless indicated otherwise, however, all reference numerals can be found at least in FIG. 3. The inversion handler 35 has an arm 50 which is rotatable around a main shaft 80, which shaft is positioned on a wheel 41. In the embodiment pictured in FIG. 3, holes 42 are cut in the wheel 41 to reduce weight. The main shaft 80 rotates when the wheel 41, on which it is positioned, is moved by a servo motor 70. The servo motor 70 drives a pulley system which moves the wheel 41 and, thereby, the shaft 80 and the arm 50. The pulley system includes a driving pulley 60, a driven pulley 90, and a timing belt 100.

The arm 50 holds a holding assembly 105 of the inversion handler 35. The holding assembly 105 includes a stationary finger 110 and a spring preload movable finger 120, which is driven by an air cylinder 180. A second air cylinder 190, an insertion/removal air cylinder, is situated below the holding assembly 105 and the arm 50. The insertion/removal air cylinder 190 raises and lowers the holding assembly 105. Two precising pins 130 at the top of the holding assembly 105 are spaced outside of the stationary finger 110 and the movable finger 120.

Referring to FIG. 4, the inversion handler 35 also contains end of travel sensors 200 and a servo home position sensor 202.

2. Operation

Figure 2A:
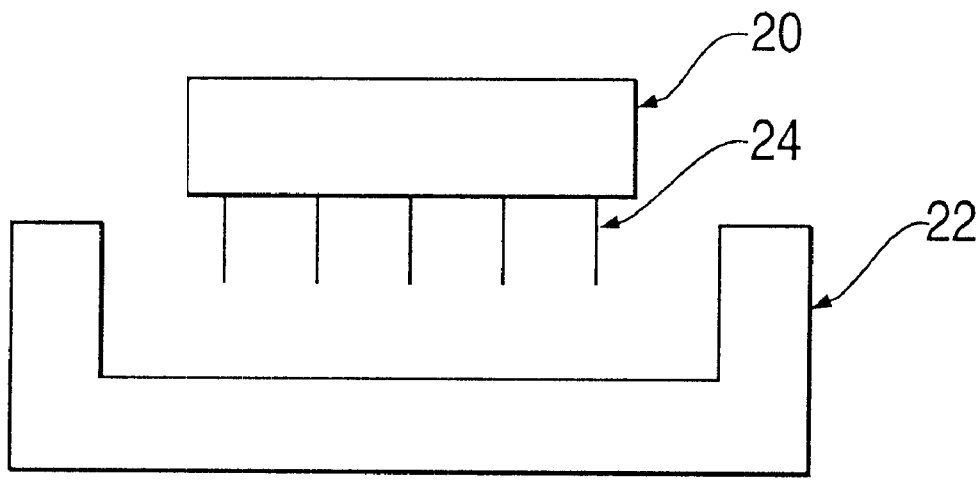
FIG. 2A is a cross-sectional side view of an IC device in a live bug position.

As depicted in FIG. 2A, the IC device 20 is positioned in the tray 22 in a "live bug" position, that is, with its connections 24 pointing down to the tray 22. In the staging area 30 (see FIG. 1), the IC device 20 is picked up by a vacuum handler (not illustrated) which places the IC device 20 in the inversion handler 35. Referring to FIG. 3, once the IC device 20 is in the inversion handler 35 it is still in a live bug position (connections, not shown, pointing down toward the inversion handler 35). Connections 24 can be referred to more generally as contacts, and contacts can take many forms, including without limitation pins, leads, balls, and pads.

The air cylinder 180 controls the spring preload movable finger 120. When actuated, the spring preload movable finger 120 travels towards the IC device 20, so that the IC device 20 is held between the stationary finger 110 and the movable finger 120. In alternate embodiments, other forms of holding mechanisms could be used, either alone or in combination, such as applying suction to the IC device 20 to hold it in place, using two or more movable fingers, using two or more stationary fingers, using a clamp or vise, otherwise applying gripping pressure, or providing a restraining force. FIGS. 4–5 show an embodiment in which three stationary fingers 110 and one movable finger 120 are used.

While the IC device 20 is held between the stationary finger 110 and the movable finger 120, the servo motor 70 rotates the wheel 41 and the attached arm 50, preferably approximately 180 degrees, to a position above the carrier 40 (illustrated in FIG. 1) in the rotary transport device 45 (illustrated in FIG. 1) in a manner such that the IC device 20 is positioned over the carrier 40 in a "dead bug" position, with connections 24 pointed up, away from the carrier 40. The insertion/removal air cylinder 190 lowers the holding assembly 105 until the precising pins 130 engage holes (not shown) in the carrier 40, thus ensuring horizontal alignment. Vertical alignment is ensured by tracking the distance through which the arm 50 has rotated.

Figure 2B:
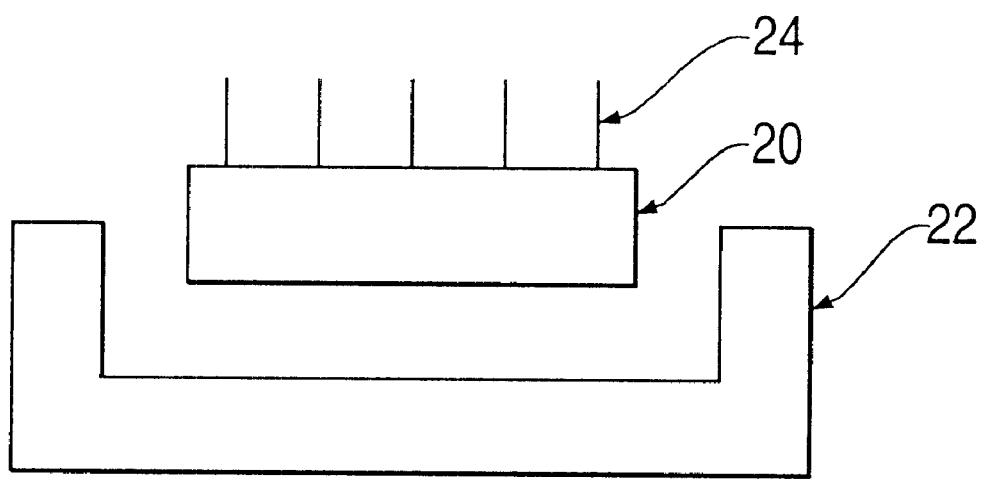
FIG. 2B is a cross-sectional side view of an IC device in a dead bug position.

Once the precising pins 130 are engaged, the air cylinder 180 is activated to allow the movable finger 120 to travel away from the IC device 20. Then the insertion/removal air cylinder 190 raises the holding assembly 105, leaving the IC device 20 in the carrier in a dead bug position (see FIG. 2B).

As described in co-pending provisional application U.S. Ser. No. 60/110,829, the IC device 20 can now be rotated for testing and/or temperature adjustment.

When the IC device 20 is ready for removal, the insertion/removal air cylinder 190 lowers the holding assembly 105 to engage the carrier 40. The air cylinder 180 then activates to allow the stationary finger 110 and the movable finger 120 to grip the IC device 20. Air cylinder 190 then raises the holding assembly 105, which is gripping the IC device 20, thus leaving the carrier 40 empty. Servo motor 70 then rotates the arm 50 with the holding assembly 105 back to the staging area 30, preferably through an arc of approximately 180 degrees.

After return to the staging area 30 (illustrated in FIG. 1), the air cylinder 180 activates to release the gripping pressure on the IC device 20 by moving the movable finger 120 away from the IC device 20. A decrease in air pressure in the air cylinder 180 first allows the spring in the spring preload movable finger 120 to expand and then allows the movable finger 120 to move away from IC device 20. Embodiments may also utilize air pressure or another force in alternate ways, such as by changing the direction of the air pressure, to move the movable finger 120 away from or towards the IC device 20. The IC device 20 is then picked up by the vacuum handler and placed in a JEDEC tray (see, for example, FIG. 1), the particular tray possibly being determined by the results of the test on the IC device 20. The process may then repeat.

In normal operation, the end of travel sensors 200 are not activated (see FIG. 4). However, if the arm 50 rotates beyond the normal operating range, then one of these sensors 200 will be activated. The sensors 200 are inductive proximity sensors, and can sense a steel dowel pin (not shown) on the arm 50 and then trigger to stop the motion of the arm 50. Other mechanisms for providing a safety stop can also be utilized. The servo home position sensor 202 is used to place the arm 50 in a known position for calibration.

The inversion handler 35, can be controlled in a variety of ways known in the art. In one embodiment, the servo motor 70 and the air cylinders 180, 190 can be controlled, for example and without limitation, by a stand alone servo control system (not shown) which is controlled by a computer system (not shown). The computer system may also be designed to control and operate the rotary handler 45 (see FIG. 1) or another unit which acts upon the device 20.

3. Further Embodiments and Applications

The inversion handler 35 is the preferred apparatus for placing the IC device 20 in the carrier 40 because it places the IC device 20 in the carrier 40 in the dead bug position, with Connections 24 pointing up. The dead bug position is the preferred position for the IC device 20 while in the carrier 40 for the purposes of an embodiment of the present invention. Having the IC device 20 in a dead bug position is particularly advantageous when using the rotary transport device 45, because the rotary transport device positions the IC device 20 under a test apparatus.

As described in the co-pending patent application U.S. Ser. No. 60/110,829, the IC device 20, with its upwardly pointing connections 24, is pushed upward into a test head by an actuator mechanism. The upward pressure exerted by the actuator mechanism sockets the upwardly pointing IC device connections 24 in socket receptacles of the test head and allows for testing. After testing, the actuator mechanism withdraws and the IC device 20 is decoupled from the test actuator and is returned to the carrier 40.

The carrier 40 may hold one or more IC devices 20. The carrier 40 may be designed for particular device numbers, geometries, packages, etc., and it may also be designed to accommodate a variety of different devices. These IC devices 20 may be inverted by an inversion handler 35 individually, in groups, or all at once. The design choice may be influenced by the particular test being performed. For tests in which IC devices 20 are tested in parallel, for example, it can be advantageous to invert the IC devices 20 in parallel as well.

There are also a variety of ways in which an inversion handler 35 can invert one or more devices 20 at the same time. The stationary finger(s) 110 can be designed for the geometry and packaging of one or more particular devices, either alone or in combinations, and can also be designed to allow a variety of different devices to be held in place. A set of fingers 110, 120 can be designed to grip several IC devices 20 at a time. A variety of embodiments alternatively include multiple sets of fingers 110, 120 on a single holding assembly 105, where each set 110, 120 is used for a single IC device 20.

Figure 6:
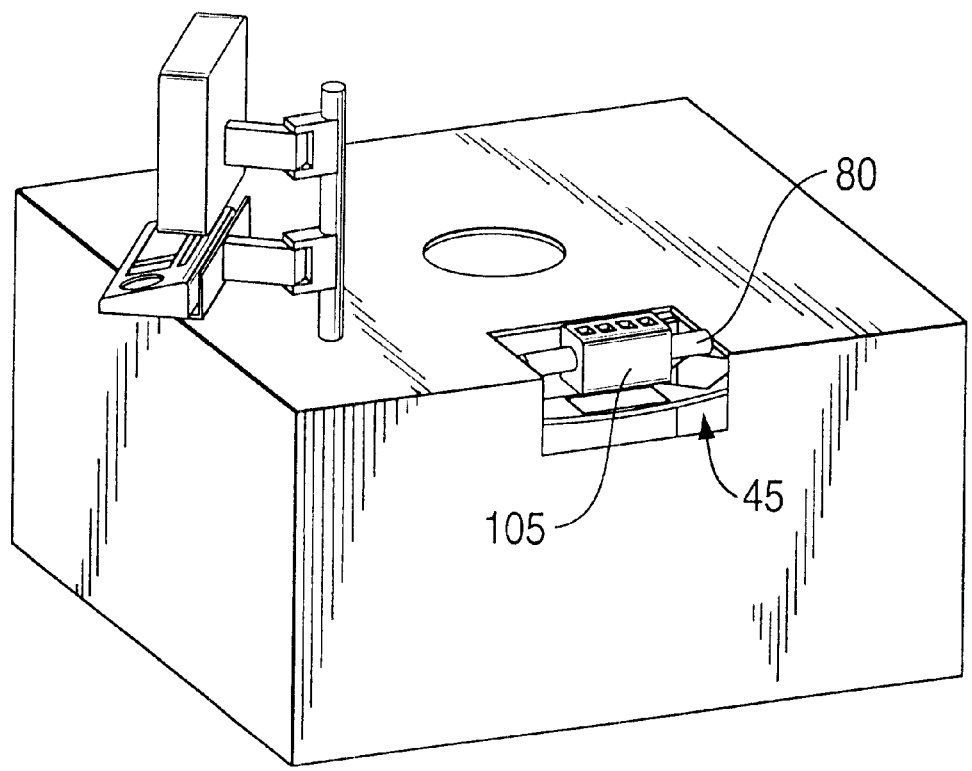
FIG. 6 is a perspective view showing an inversion handler in accordance with an embodiment of the present invention.
Figure 7A:
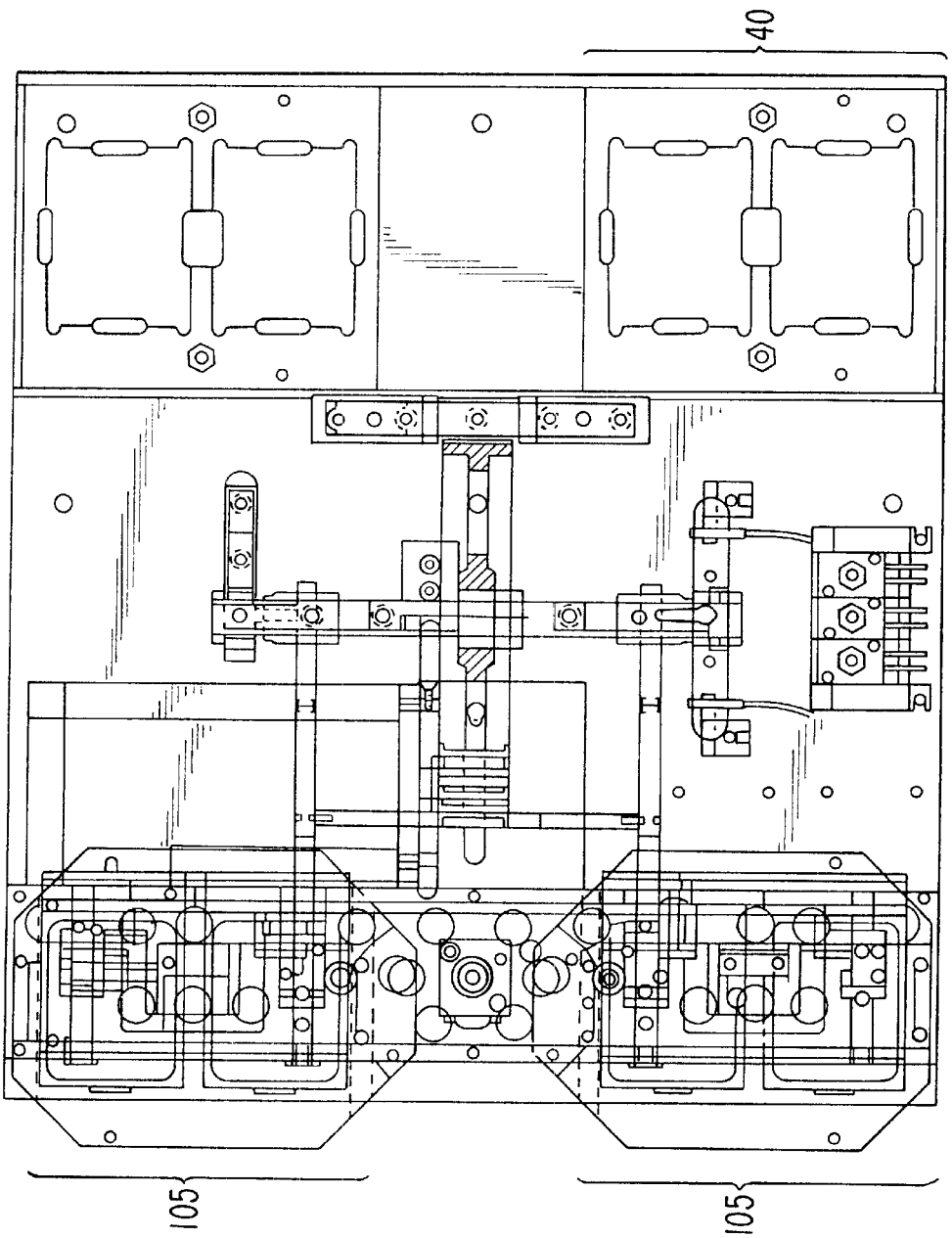
FIG. 7A is a top plan view of an inversion handler in accordance with an embodiment of the present invention.
Figure 7B:
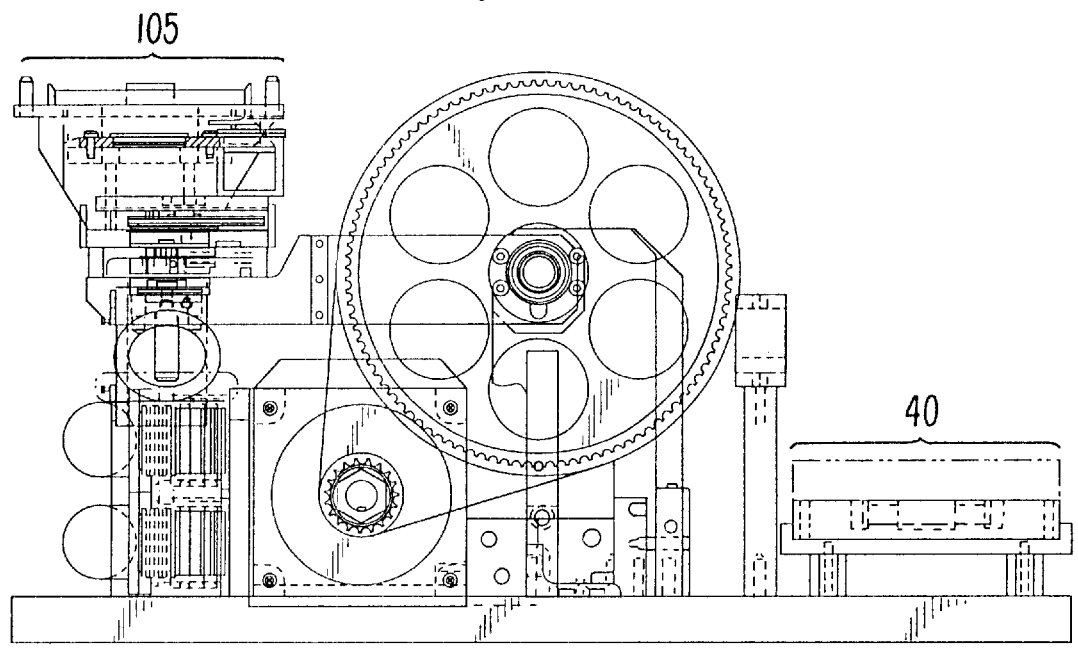
FIG. 7B is a side view of the inversion handler of FIG. 7A.
Figure 7C:
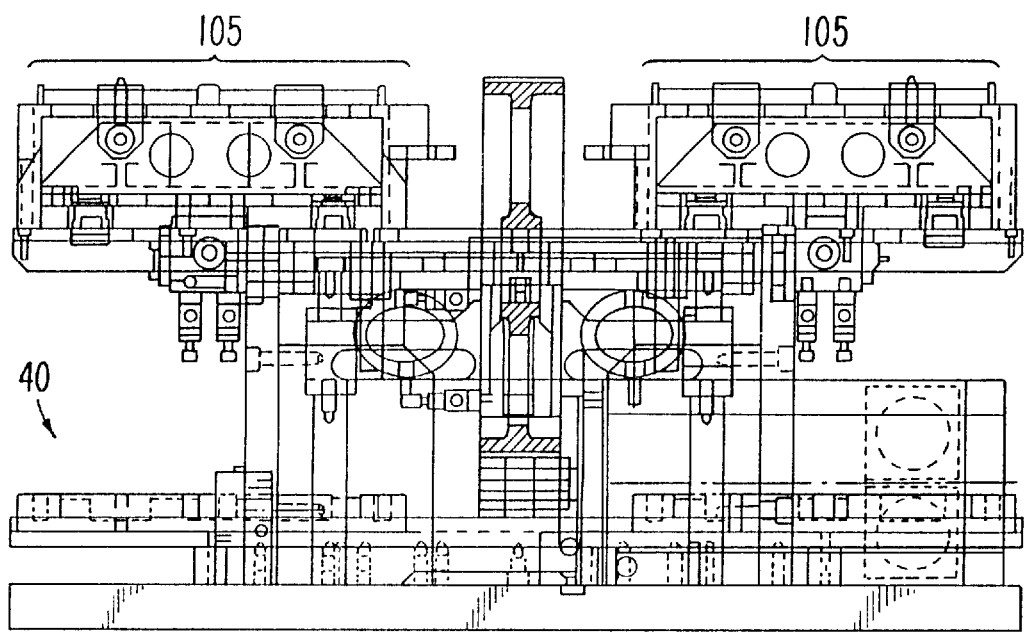
FIG. 7C is an end view of the inversion handler of FIG. 7A.

FIG. 1 shows an embodiment in which the inversion handler 35 and the carriers 40 are designed to accommodate two IC devices 20 each. This is particularly clear upon viewing each of the eight carriers 40 on the rotary transport device 45. FIG. 6 shows an embodiment in which four IC devices 20 are accommodated in a single holding assembly 105. FIGS. 7A–C show an embodiment in which an inversion handler 35 contains two holding assemblies 105, each of which is designed to accommodate two IC devices 20. This is particularly clear upon viewing the two carriers 40 of FIG. 7A, each of which can handle two IC devices 20, and upon viewing the two holding assemblies 105 of FIG. 7C, each of which can handle two IC devices 20. As revealed by the disclosed embodiments, multiple IC devices 20 can be accommodated in a carrier 40 and/or a holding assembly 105 in a variety of configurations and geometries.

Embodiments may also supplement or replace the gripping pressure of the fingers 110, 120 with suction or other mechanisms of holding a device. One or more of the fingers 110, 120 may be designed, as shown in FIGS. 3–5, with vertical portions contacting the device. Additionally, one or more of the fingers may also be designed with a non-vertical portion which effectively restrains a device or locks it into place by, for example and without limitation, having a curved shape which prevents the device from falling out when it is inverted. Such a non-vertical design may be advantageous for use with devices, for example and without limitation, which are particularly fragile, brittle, malleable, or which have exposed conductors.

Further, the inversion handler 35 can be used with devices which are in any orientation. For example, and without limitation, a device could be in a dead bug orientation, a live bug orientation, or the pins could be pointing out to one side. Those of ordinary skill in the art will also appreciate that the inversion handler 35 can be used to transfer a variety of different semiconductor device packages, including without limitation dual in-line package ("DIP"), single in-line package ("SIP"), flip chips, and surface mount. Also, as previously discussed, the electrical contacts of an IC device 20 can take many forms, including without limitation pins, leads, balls, and pads.

The inversion handler 35 can also be used between a variety of different handlers, platforms, testers, transport devices, etc., including without limitation, rotary handlers, non-rotary handlers, and conveyor belts. The inversion handler 35 can be adapted to insert a device directly into a socket instead of placing it on a carrier 40. Such a socketing handler can also be adapted so that at least part of the motion of the holding assembly 105 and/or arm 50 occurs in a horizontal or other plane, as opposed to only in the vertical plane as in the illustrated embodiment. The inversion handler 35 can also be adapted to manufacturing or other environments, in addition to the test environment of the illustrated embodiment.

Embodiments may also utilize different geometries and/or coupling mechanisms between the holding assembly 105 and the shaft 80. The illustrated embodiment uses an arm 50 that couples to the shaft 80 at an angle of ninety degrees. In the illustrated embodiment, therefore, the holding assembly 105 and the arm 50 rotate through one-hundred eighty degrees of arc in a vertical plane which is perpendicular to the axis of the shaft 80. Another embodiment uses an arm which couples to the shaft 80 at an angle other than ninety degrees, for example, forty-five degrees. In this other embodiment, the holding assembly 105, and not the arm, still rotates in a vertical plane which is perpendicular to the axis of the shaft 80. The arm of this other embodiment, however, traces out a cone as it rotates and is not rotated in a vertical plane.

Embodiments need not rotate the holding assembly along the arc of a circle. Through the use of a hinged and moving arm, a system of gears, or other devices, the holding assembly may trace out portions of an ellipse, a straight line, a right angle, or any other curve or line. In these embodiments, however, the holding assembly is still rotated in a vertical plane which is, preferably, perpendicular to the axis of the shaft. This provides efficiency in flipping the IC device. If a vertical plane is not used, then the IC device will not be flipped by the rotation alone. The axis of the shaft need not be perpendicular to the vertical plane, as for example with gears that are not at right angles to each other, but such a design is preferred.

As shown in FIG. 6, another embodiment does not use an arm at all, but has the shaft 80 going through the center of the holding assembly 105. The configuration of FIG. 6 minimizes the lateral motion of the IC devices 20, which are inverted and placed on the rotary transport device 45 below the holding assembly 105. The configuration of FIG. 6 allows a more compact design, and eliminates any need for counterbalancing the force of a rotating arm. As one of ordinary skill in the art will appreciate, there are many variations and configurations that will permit the inversion of a device 20 being supported or contained by a holding assembly 105.

The principles, preferred embodiments, and modes of operation of the present invention have been described in the foregoing specification. The invention is not to be construed as limited to the particular forms disclosed, because these are regarded as illustrative rather than restrictive. Moreover, variations and changes may be made by those of ordinary skill in the art without departing from the spirit of the invention.

We claim:

1. An inversion handler for inverting an integrated circuit ("IC") device under test ("DUT"), the inversion handler comprising:

a stationary finger;

a movable finger coupled to the stationary finger, wherein the movable finger is adapted to be moved to releasably secure the IC DUT between the stationary finger and the movable finger;

an arm coupled to the stationary finger;

a shaft coupled to the arm;

a driving device coupled to the shaft, to rotate the shaft approximately one-hundred eighty degrees, wherein such rotation will rotate the stationary finger and the movable finger in a vertical plane which is perpendicular to the axis of the shaft, such that the stationary finger and the movable finger are inverted; and a precising pin coupled to the stationary finger, for engaging with a carrier which is designed to carry the IC DUT.

2. The inversion handler of claim 1, further comprising the IC DUT, wherein the IC DUT is releasably secured between the stationary finger and the movable finger, and wherein inversion of the stationary finger and the movable finger also inverts the IC DUT.

3. An inversion handler for inverting a device under test ("DUT"), the inversion handler comprising:

a holding assembly for releasably securing the DUT;

a shaft, coupled to the holding assembly, wherein the shaft is adapted to be rotated approximately one-hundred eighty degrees, thereby rotating the holding assembly approximately one-hundred eighty degrees in a vertical plane such that the holding assembly is inverted; and a precising pin for engaging the holding assembly with a carrier which is designed to carry the DUT.

4. The inversion handler of claim 3, wherein the vertical plane is perpendicular to the axis of the shaft.

5. The inversion handler of claim 3, wherein the shaft is adapted to be rotated approximately one-hundred eighty degrees in one continuous motion.

6. The inversion handler of claim 3, wherein the DUT is an integrated circuit device.

7. An integrated circuit ("IC") test system, for testing IC devices at a specified temperature comprising the inversion handler of claim 3.

8. The inversion handler of claim 3, wherein the holding assembly is adapted to be rotated about the axis of the shaft.

9. The inversion handler of claim 3, wherein the shaft goes through the center of the holding assembly, such that the holding assembly is adapted to be rotated about its own axis.

10. The inversion handler of claim 3, further comprising an arm disposed between the holding assembly and the shaft.

11. The inversion handler of claim 3, wherein the holding assembly comprises:

a stationary finger; and a movable finger, wherein the movable finger is adapted to be moved to releasably secure the DUT between the stationary finger and the movable finger.

12. The inversion handler of claim 11, further comprising an air cylinder for moving the movable finger toward the stationary finger, and wherein the movable finger is spring loaded and the spring is compressed by force from the air cylinder.

13. The inversion handler of claim 3, further comprising:

a wheel connected to the shaft; and a driving device to rotate the wheel and the shaft.

14. The inversion handler of claim 13, wherein the driving device comprises:

a driven pulley connected to the wheel;

a driving pulley;

a motor connected to the driving pulley; and a timing belt extending between the driving pulley and the driven pulley.

15. The inversion handler of claim 3, wherein the holding assembly is adapted to releasably secure a plurality of DUTs.

16. The inversion handler of claim 15, wherein the holding assembly comprises:

a first stationary finger and a first movable finger, adapted to releasably secure a first DUT; and a second stationary finger and a second movable finger, adapted to releasably secure a second DUT.

* * * * *